(12) United States Patent
Peterson et al.

(10) Patent No.: US 6,465,357 B1
(45) Date of Patent: Oct. 15, 2002

(54) FABRICATING STRUCTURES USING CHEMO-MECHANICAL POLISHING AND CHEMICALLY-SELECTIVE ENDPOINT DETECTION

(75) Inventors: Jeffrey J. Peterson, Folsom; Charles E. Hunt, Davis, both of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/900,299

(22) Filed: Jul. 5, 2001

(51) Int. Cl.[7] .............................................. H01L 21/311
(52) U.S. Cl. ......................... 438/694; 438/52; 438/739
(58) Field of Search ................................ 438/478, 739, 438/52, 21, 694; 257/415, 416, 417, 418, 419, 420; 216/27

(56) References Cited

U.S. PATENT DOCUMENTS

| | | | | |
|---|---|---|---|---|
| 5,906,708 A | * | 5/1999 | Robinson et al. | ......... 156/657.1 |
| 5,914,507 A | * | 6/1999 | Polla et al. | .................. 257/254 |
| 5,961,877 A | * | 10/1999 | Robinson et al. | .......... 252/79.2 |
| 6,064,081 A | * | 5/2000 | Robinson et al. | ........... 257/183 |

OTHER PUBLICATIONS

S. Wolf, "Silicon Processing for the VLSI Era–vol. 2," 1990, Lattice Press, vol. 2, pp. 238–239.*

* cited by examiner

Primary Examiner—Olik Chaudhuri
Assistant Examiner—Timothy Sutton
(74) Attorney, Agent, or Firm—Park Vaughan & Fleming LLP

(57) ABSTRACT

One embodiment of the present invention provides a process that uses selective etching to form a structure on a silicon substrate. The process starts by receiving the silicon substrate with a first layer composed of a first material, which includes voids created by a first etching operation. The process then forms a second layer composed of a second material over the first layer, so that the a second layer fills in portions of voids in the first layer created by the first etching operation. Next, the process performs a chemo-mechanical polishing operation on the second layer down to the first layer so that only remaining portions of the second layer, within the voids created by the first etching operation, remain. The system then forms a third layer composed of a third material over the first layer and the remaining portions of the second layer, and performs a second etching operation using a selective etchant to remove the remaining portions of the second layer, thereby creating voids between the first layer and the third layer.

29 Claims, 9 Drawing Sheets

(VIEW 614)

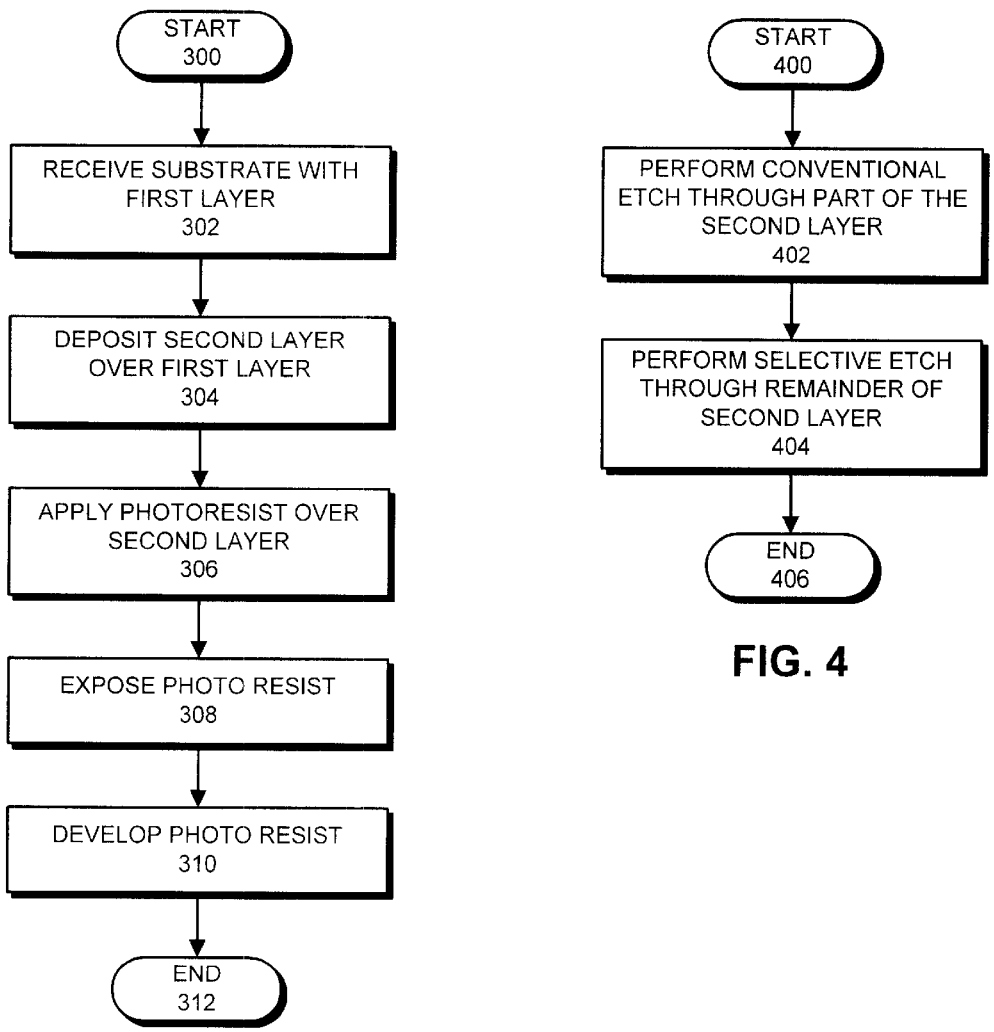

(VIEW 614)

(VIEW 714)

FABRICATING STRUCTURES USING CHEMO-MECHANICAL POLISHING AND CHEMICALLY-SELECTIVE ENDPOINT DETECTION

Related Application

The subject matter of this application is related to the subject matter in a co-pending non-provisional application by the same inventors as the instant application and filed on the same day as the instant application entitled, "Method and Apparatus for Fabricating Structures Using Chemically-Selective Endpoint Detection," having Ser. No. 09/900,300, and filing date Jul. 5, 2001.

GOVERNMENT LICENSE RIGHTS

This invention was made with United States Government support under Grant Nos. N00014-93-C-0114 and N00014-96-0219 awarded by the Office of Naval Research. The United States Government has certain rights in the invention.

BACKGROUND

1. Field of the Invention

The present invention relates to the process of manufacturing structures on a silicon substrate. More specifically, the present invention relates to devices created through a process that uses chemically-selective endpoint detection to fabricate structures on a silicon substrate.

2. Related Art

The dramatic advances in computer system performance during the past 20 years can largely be attributed to improvements in the processes that are used to fabricate integrated circuits. By making use of the latest processes, integrated circuit designers can presently integrate computing systems comprised of hundreds of millions of transistors onto a single semiconductor die which is a fraction of the size of a human fingernail.

This integrated circuit fabrication technology is also being used to fabricate Micro-Electro-Mechanical Systems (MEMs), such as microscopic motors and other types of actuators, that are invisible to the unaided human eye, and which have dimensions measured in fractions of microns.

A typical fabrication process builds structures through successive cycles of layer deposition and subtractive processing, such as etching. As the dimensions of individual circuit elements (or MEMs structures) continues to decrease, it is becoming necessary to more tightly control the etching operation. For example, in a typical etching process, etching is performed for an amount of time that is estimated by taking into account the time to etch through a layer to reach an underlying layer, and the time to overetch into the underlying layer. However, this process can only be controlled to +/− 100 Angstroms, which can be a problem in producing Heterojunction Bipolar Transistors (HBTs), in which some layers may only be only hundreds of Angstroms thick.

Furthermore, conventional etching processes that indiscriminately etch all exposed surfaces are not well-suited to manufacture some finely detailed MEMs structures that require tighter control over subtractive processing operations.

What is needed is a process and an apparatus that facilitates selective etching to form a structure on a silicon or other substrate.

SUMMARY

One embodiment of the present invention provides a process that uses selective etching to form a structure on a silicon substrate. The process starts by receiving the silicon substrate with a first layer composed of a first material, which includes voids created by a first etching operation. The process then forms a second layer composed of a second material over the first layer, so that the second layer fills in portions of voids in the first layer created by the first etching operation. Next, the process performs a chemo-mechanical polishing operation on the second layer down to the first layer so that only remaining portions of the second layer, within the voids created by the first etching operation, remain. The system then forms a third layer composed of a third material over the first layer and the remaining portions of the second layer, and performs a second etching operation using a selective etchant to remove the remaining portions of the second layer, thereby creating voids between the first layer and the third layer.

In one embodiment of the present invention, the etch rate of the selective etchant through the second material is faster than the etch rate of the selective etchant through the first material and the third material, so that the second etching operation etches through the remaining portion of the second layer without significantly etching the first layer and the third layer.

In one embodiment of the present invention, receiving the silicon substrate involves, receiving the silicon substrate with the first layer composed of the first material, and applying a photoresist layer over the first layer. It also involves exposing the photoresist layer through a mask and developing the exposed photoresist layer, whereby portions of the photoresist layer defined by the mask are removed, so that portions of the first layer are exposed. Next, the process performs the first etching operation to create voids in exposed regions of the first layer, and removes the photoresist layer.

In one embodiment of the present invention, the first etching operation is a reactive ion etch.

In one embodiment of the present invention, the first material and the third material are substantially the same material.

In one embodiment of the present invention, the chemo-mechanical polishing operation takes place after forming the third layer.

In one embodiment of the present invention, the second layer is a conformal layer that fills part but not all of a void created by the first etching operation, and the third layer fills in a remaining portion of the void created by the first etching operation.

In one embodiment of the present invention, the voids created between the first layer and the third layer define one or more capillaries between the first layer and the third layer.

In one embodiment of the present invention, the first material comprises Si—Ge—C, the second material comprises Si, and the selective etchant comprises KOH. Note that the term "Si—Ge—C" is used to refer to $Si_{1-X-Y}Ge_XC_Y$ throughout this specification.

In one embodiment of the present invention, the first material comprises Si—Ge—C, wherein the carbon is approximately one atomic percent, the second material comprises Si, and the selective etchant is $KOH-H_2O$. Note that the term KOH as used in this specification can refer to an aqueous reagent KOH diluted with $H_2O$ or Isopropanol or other alcohols.

In one embodiment of the present invention, the first material comprises Si, the second material comprises Si—Ge or Si—Ge—C, and the selective etchant comprises TMAH or HNA.

In one embodiment of the present invention, the second layer includes one or more silicon and/or polysilicon layers.

BRIEF DESCRIPTION OF THE FIGURES

FIG. 2C illustrates a selective etching operation combined with a subsequent conventional overetching operation in accordance with an embodiment of the present invention.

FIG. 3 is a flow chart illustrating the process of forming a photoresist layer in accordance with an embodiment of the present invention.

FIG. 4 is a flow chart illustrating a conventional etching operation combined with a subsequent selective etching operation in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital videodiscs), and computer instruction signals embodied in a transmission medium (with or without a carrier wave upon which the signals are modulated). For example, the transmission medium may include a communications network, such as the Internet.

Conventional Etching Operation

Figure 1:
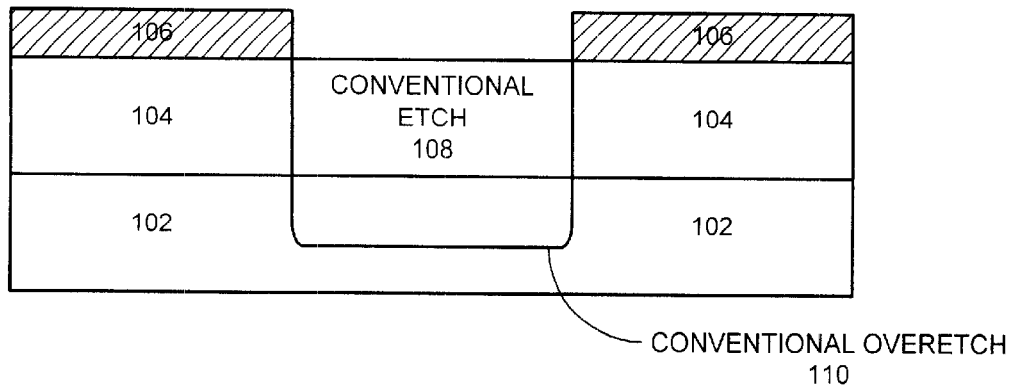
FIG. 1 illustrates a conventional etching operation.

FIG. 1 illustrates a conventional etching operation. This conventional etching operation 108 etches through a portion of Si layer 104 that is exposed through an opening in photoresist layer 106. To make certain that contact is made with underlying Si layer 102, the conventional etching operation typically involves overetching into underlying Si layer 102.

This conventional etching operation can be performed through a dry reactive ion etch, or alternatively through use of a wet chemical etchant. Note that the etch rate of the conventional etching operation is the same through silicon layer 104 and underlying silicon layer 102. Also note that the depth of the conventional etching operation is typically controlled by estimating a target time to reach underlying layer 102 and then adding additional time for overetching into silicon layer 102. Because of process variations, it is hard to control the depth of this conventional etching operation simply based on time. For example, using current processes, conventional etching can be controlled to about +/− 100 Angstroms.

Selective Etching Operation

Figure 2A:
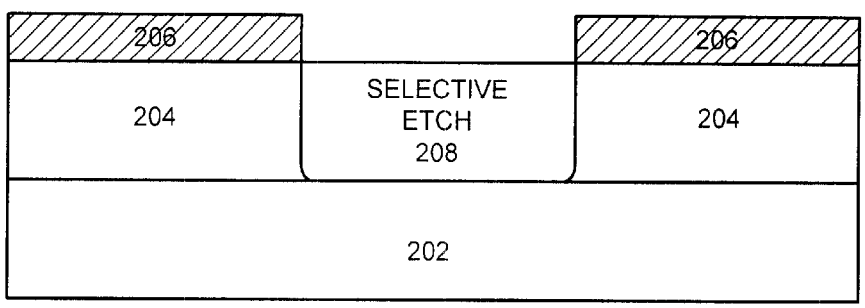
FIG. 2A illustrates a selective etching operation in accordance with an embodiment of the present invention.

FIG. 2A illustrates a selective etching operation in accordance with an embodiment of the present invention. This selective etching operation 208 etches through a region of Si layer 204 that is exposed through an opening in photoresist layer 206. However, unlike the conventional etching operation, the selective etching operation 208 uses a selective etchant, such as Potassium Hydroxide (KOH), which has a much faster etch rate through Si than it does through Si—Ge—C. This causes the selective etching operation to essentially stop are underlying Si—Ge—C layer 202.

In one exemplary selective etching process, the overlying layer 204 is comprised of silicon, the underlying layer 202 is comprised of Si—Ge—C, wherein the carbon is approximately one atomic percent, and the selective etchant is 10–45 wt % KOH—$H_2O$ and is maintained at a temperature in the range of 50 to 100 degrees Centigrade.

In another selective etching process, overlying layer 204 is comprised of Si—Ge—C, and underlying layer 202 is comprised of Si. In this process, the selective etchant is comprised of TetraMethylAmonium Hydroxide (TMAH) or Hydroflouric/Nitric/Acetic acids (HNA).

Using the above-described selective etching processes, it is possible to control the etching process to within +/− 10 Angstroms, which is an order of magnitude better than the +/− 100 Angstroms that can be achieved through a conventional etching process. This additional control can be useful in fabricating Heterojunction Bipolar Transistors (HBTs), Note that in general, the present invention is not limited to the above described materials and selective etchants. In general, the present invention can be used with any materials and corresponding selective etchants. For more details on selective etchants, please refer to U.S. Pat. No. 5,961,877, issued Oct. 5, 1999, entitled "Wet Chemical Etchants," which is hereby incorporated by reference to describe the selective etching process.

Conventional Etching Operation Combined with Selective Etching Operation

Figure 2B:
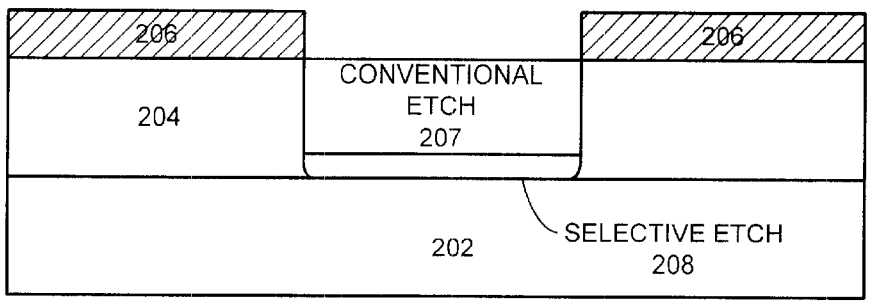
FIG. 2B illustrates a conventional etching operation combined with a subsequent selective etching operation in accordance with an embodiment of the present invention.

FIG. 2B illustrates a conventional etching operation combined with a subsequent selective etching operation in accordance with an embodiment of the present invention. The combined etching operation first uses a conventional nonselective etching operation 207, such as a reactive ion etch, to etch through some but not all of a region of Si layer 204 that is exposed through an opening in photoresist layer 206. Next, a selective etchant, such as KOH, is used to etch through the remaining portion of Si layer 204 to expose Si—Ge—C layer 202.

Note that this combined process has certain advantages. By using a conventional etching operation to perform most of the etching, some the side-effects of using a selective etchant may be avoided. It may also be faster to remove most of layer 204 using a conventional etching operation, before using a selective etchant to accurately etch down to underlying Si—Ge—C layer 202.

Selective Etching Operation and Conventional Overetching Operation

FIG. 2C illustrates a selective etching operation 208 combined with a subsequent conventional overetching operation 212 in accordance with an embodiment of the present invention. In this example, a selective etching operation 208 is used to etch through overlying Si layer 204 to the boundary of underlying Si—Ge—C layer 202. Next, a conventional etching operation is used to overetch into underlying Si—Ge—C layer 202.

It is advantageous to use the conventional etching operation to overetch into underlying Si—Ge—C layer 202 because the selective etchant cannot easily etch into Si—Ge—C layer 202. In a variation on this process, the initial selective etching operation may include an initial conventional etching operation to remove some but not all of layer 204 before using a selective etchant to remove the rest of layer 204 as is illustrated in FIG. 2B.

Process of Forming Photoresist

FIG. 3 is a flow chart illustrating the process of forming a photoresist layer 206 accordance with an embodiment of the present invention. The process starts with a substrate that includes a first layer 202 (step 302). The process then deposits a second layer 204 over the first layer 202 (step 304). This deposition operation can be accomplished using any one of a number of known deposition techniques. Next, the process applies a photoresist layer 206 over layer 204 (step 306). This photoresist layer is then exposed through a mask (reticle) (step 308) to define an exposure pattern on photoresist layer 206. Next, the process develops photoresist layer 206 to remove either the exposed or unexposed regions of photoresist layer 206 (step 310). This uncovers regions of layer 204 for subsequent etching.

Process that Combines Conventional and Selective Etching

FIG. 4 is a flow chart illustrating a conventional etching operation combined with a subsequent selective etching operation in accordance with an embodiment of the present invention. Referring to FIG. 2B, a conventional etching operation is first performed through some but not all of layer 204 (step 402). Next, a selective etching operation is performed to remove the remainder of layer 204 down to the boundary of underlying layer 202 (step 404).

Process that Combines Selective Etching and Conventional Overetching

Figure 5:
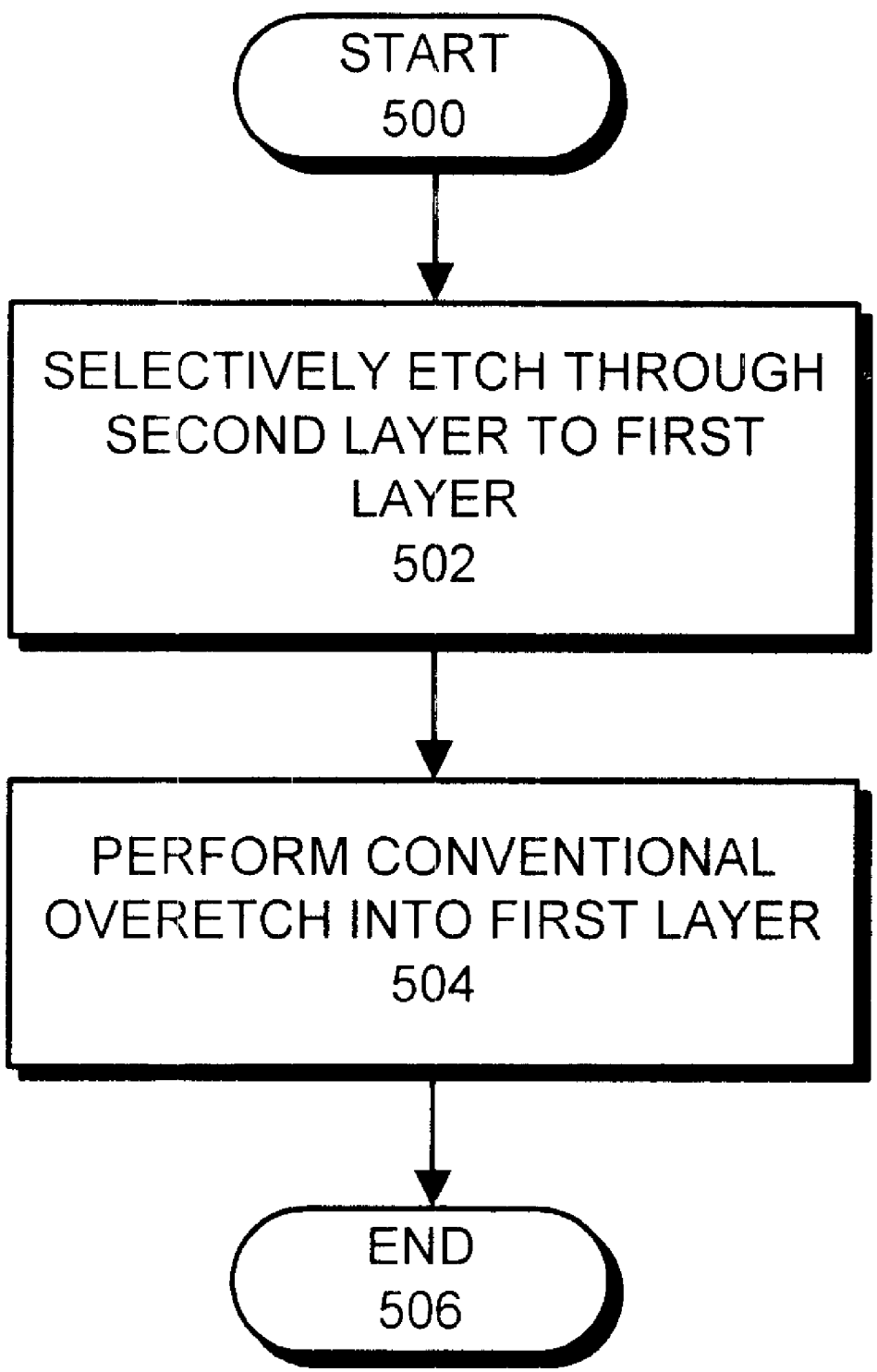
FIG. 5 is a flow chart illustrating a selective etching operation combined with a subsequent conventional overetching operation in accordance with an embodiment of the present invention.

FIG. 5 is a flow chart illustrating a selective etching operation combined with a subsequent conventional overetching operation in accordance with an embodiment of the present invention. Referring to FIG. 2C, a selective etching operation is first performed through layer 204 to the boundary of underlying layer 202 (step 502). Next, a conventional etching operation is performed to overetch into underlying layer 202 (step 504).

Selective Etching with CMP

Figure 6A:
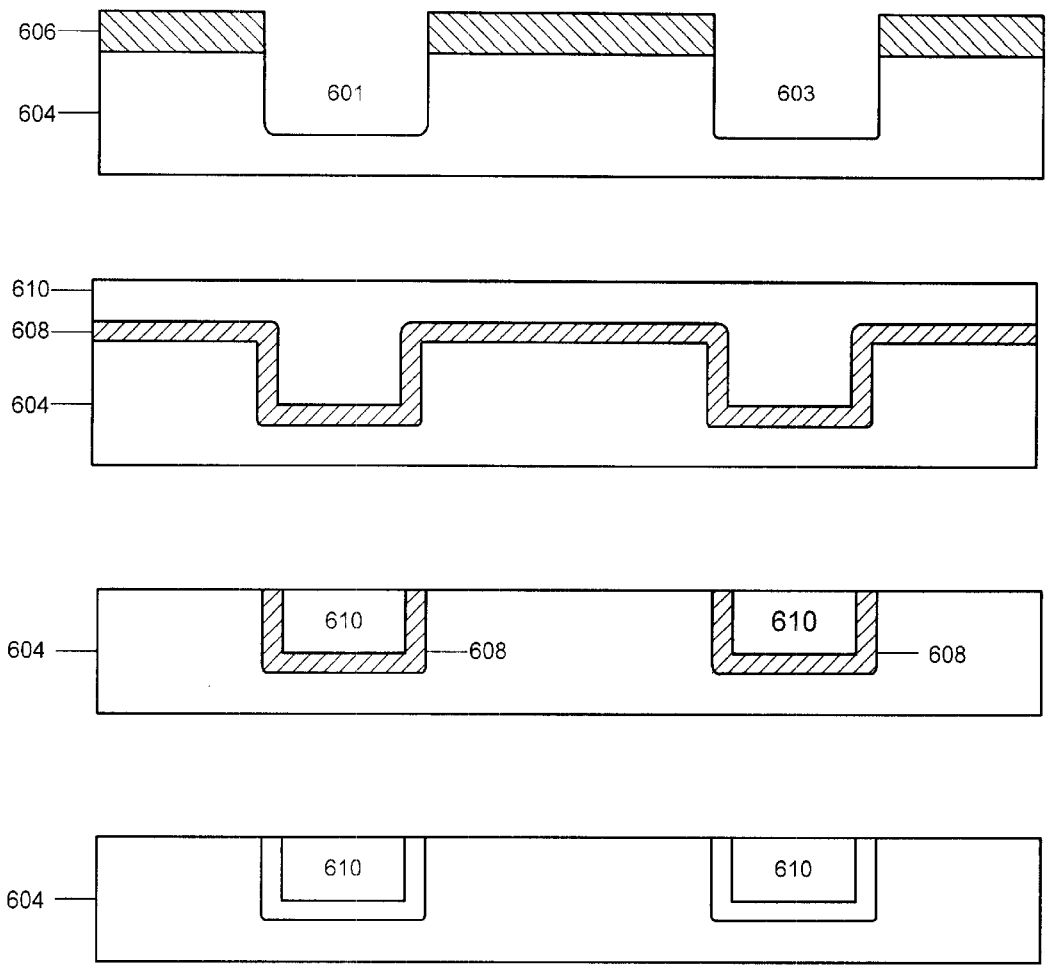
FIG. 6A illustrates how selective etching and CMP can be combined to produce a MEMs structure in accordance with an embodiment of the present invention.

FIG. 6A illustrates how selective etching and CMP can be combined to produce a MEMs structure in accordance with an embodiment of the present invention. This process starts with a first layer 604 comprised of Si—Ge—C, which has been etched through photoresist layer 606 to produce voids 601 and 603 (see the top of FIG. 6A). Next, photoresist layer 606 is removed and a thin conformal second layer 608 comprised of polysilicon or silicon is formed over the first layer. A third layer 610 of Si—Ge—C is then formed over the second layer (see the second figure from the top of FIG. 6A).

Next, a Chemo-Mechanical Polishing (CMP) operation is performed to remove material down to first layer 604, so that only those portions of second layer 608 and third layer 610 within the voids 601 and 603 remain (see the third figure from the top of FIG. 6A).

Finally, a selective etching operation is performed to remove the second layer 608 using a selective etchant, such as KOH (see bottom figure in FIG. 6A). This selective etching operation leaves behind the first Si—Ge—C layer 604 and the third Si—Ge—C layer 610.

Figure 6B:
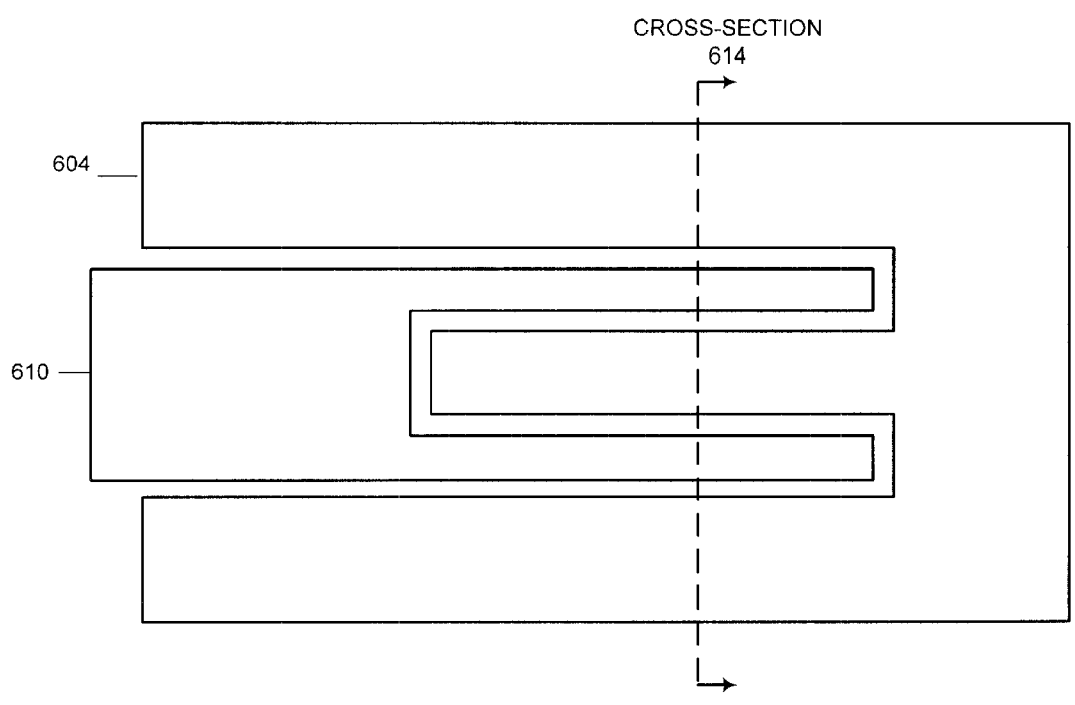
FIG. 6B presents an overview of the structure illustrated in FIG. 6A in accordance with an embodiment of the present invention.

FIG. 6B presents an overview of the structure illustrated in FIG. 6A in accordance with an embodiment of the present invention. Note that the third layer 610 forms two fingers of a comb structure that resides within, but does not contact channels within the first layer 604. This type of structure can be used, for example, as a comb structure of a MEMs motor. The vertical dashed line 614 illustrates the cross-section for the views illustrated in FIG. 6A.

Figure 7A:
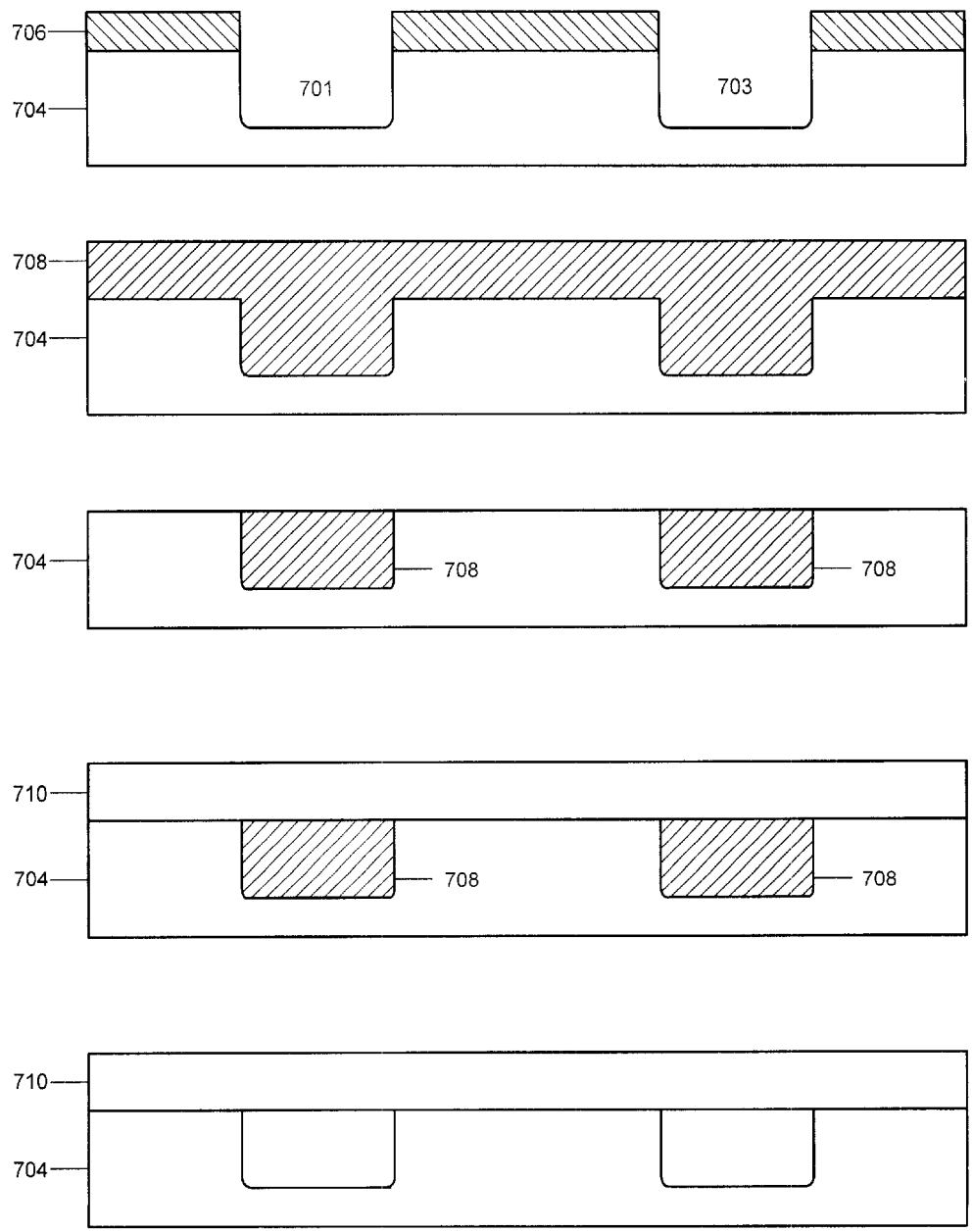
FIG. 7A illustrates how selective etching and CMP can be used to produce a capillary structure in accordance with an embodiment of the present invention.

FIG. 7A illustrates how selective etching and CMP can be used to produce a capillary structure in accordance with an embodiment of the present invention. This process starts with a first layer 704 comprised of Si—Ge—C, which has been etched through photoresist layer 706 to produce voids 701 and 703 (see the top of FIG. 7A). Next, photoresist layer 606 is removed and a second layer 708 of polysilicon or silicon is formed over the first layer 704 (see second figure from the top of FIG, 7A).

Next, a Chemo-Mechanical Polishing (CMP) operation is performed down to the first layer 704, so that only those portions of the second layer 708 within the voids 701 and 703 remain (see the third figure from the top of FIG. 7A). A third layer of Si—Ge—C is then deposited over the first layer 704 and the remainder of the second layer 708 (see second figure from the bottom of FIG. 7A).

Finally, a selective etching operation is performed to remove the second layer 708 using a selective etchant, such as KOH (see bottom figure in FIG. 7A). The removal of the remainder of the second layer 708 leaves behind a series of capillaries between first layer 704 and third layer 710. Note that "keyholes" and other entry points into the second layer 708 can be provided to allow the selective etchant to reach the second layer 708 during the selective etching process.

Figure 7B:
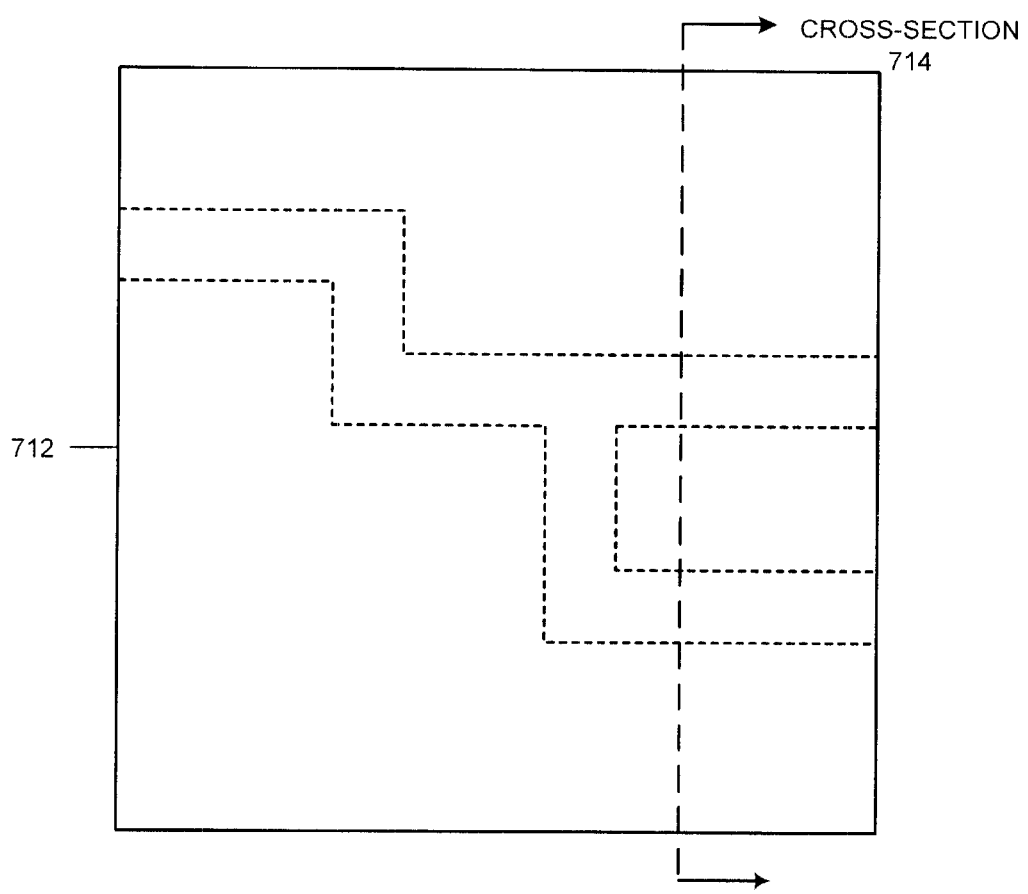
FIG. 7B presents an overview of the structure illustrated in FIG. 7A in accordance with an embodiment of the present invention.

FIG. 7B presents an overview of the structure illustrated in FIG. 7A in accordance with an embodiment of the present invention. The dotted lines illustrate the capillaries formed by the selective etching process between first layer 704 and the third layer 710. The vertical dashed line 714 illustrates the cross-section for the views illustrated in FIG. 7A.

Figure 8:
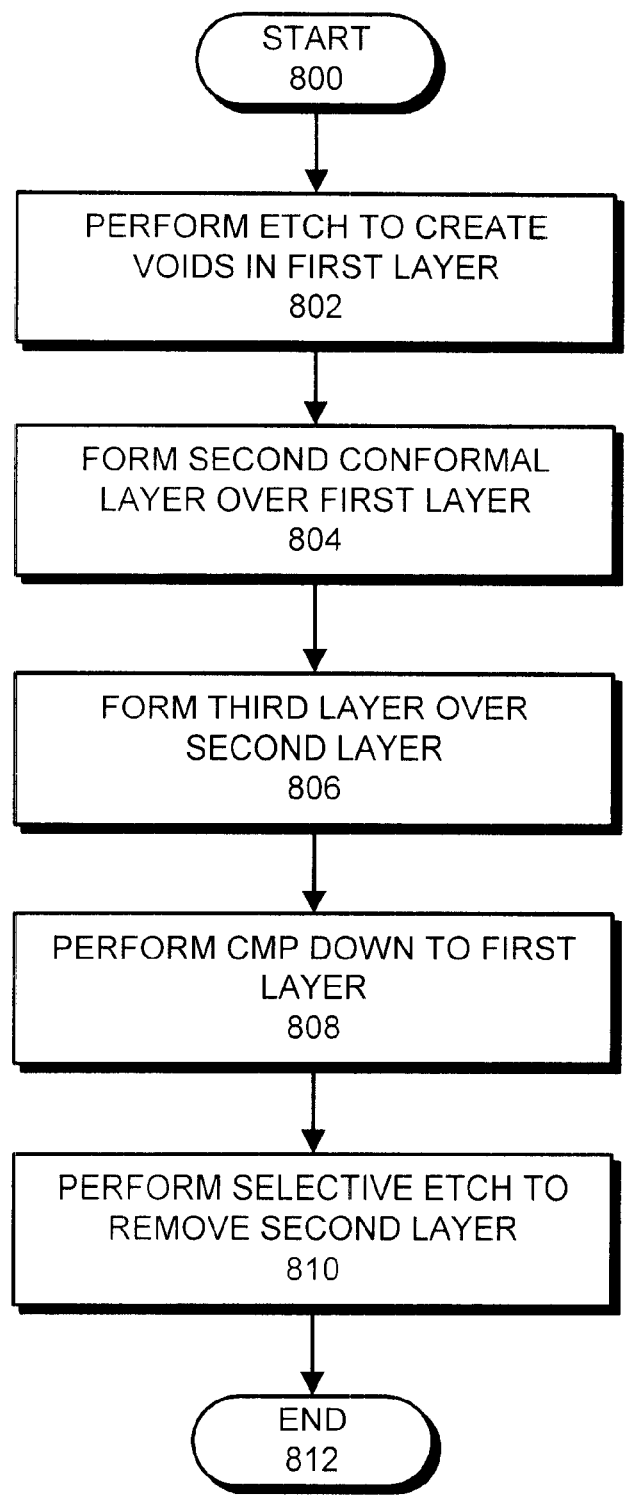
FIG. 8 is a flow chart of the process of forming the structure illustrated in FIG. 6A in accordance with an embodiment of the present invention.

FIG. 8 presents a flow chart of the process of forming the structure illustrated in FIG. 6A in accordance with an embodiment of the present invention. Referring to FIG. 6A, the process first performs a conventional etching operation to create voids 601 and 603 in first layer 604 (step 802). After photoresist layer 606 is removed, the process forms the second layer 608 of conformal polysilicon or silicon over the first layer (step 804), and then forms the third layer 610 of Si—Ge—C over the second layer (step 806). The process then performs a CMP operation to remove material down to the first layer 604, so that only the portions of the second layer 608 and the third layer 610 within voids 601 and 603 remain (step 808). Finally, the system performs a selective etching operation to remove the remainder of the second layer 608 (step 810).

Figure 9:
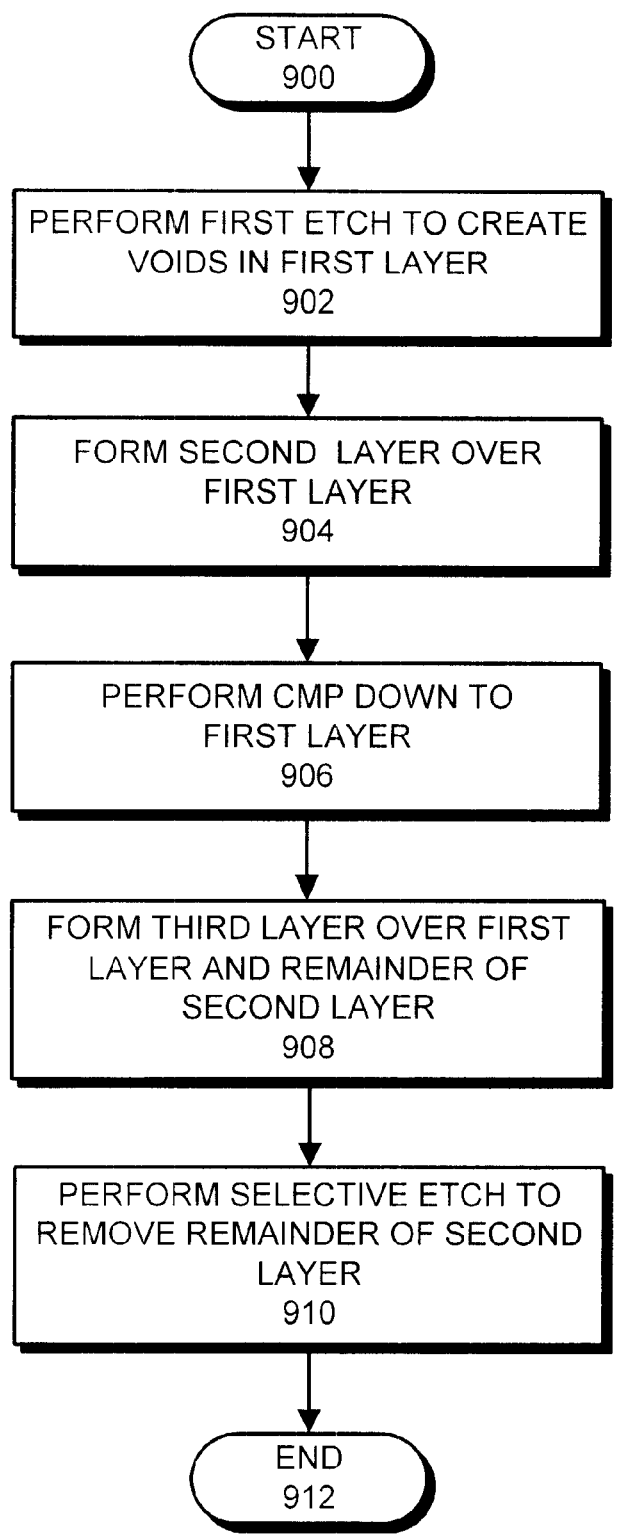
FIG. 9 is a flow chart of the process of forming the structure illustrated in FIG. 7A in accordance with an embodiment of the present invention.

FIG. 9 presents a flow chart of the process of forming the structure illustrated in FIG. 7A in accordance with an embodiment of the present invention. Referring to FIG. 7A, the process first performs a conventional etching operation to create voids 701 and 703 in first layer 704 (step 902). After photoresist layer 706 is removed, the process forms a second layer 708 of Si—Ge—C over first layer 704 (step 904). The process then performs a CMP operation down to first layer 704, so that only the portions of second layer 708 within voids 701 and 703 remain (step 906). The system then forms third layer 710 over first layer 704 and the remainder of second layer 708 (step 908). Finally, the system performs a selective etching operation to remove the remainder of the second layer 708 to form capillaries between first layer 704 and third layer 710 (step 910).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using selective etching to form a structure on a silicon substrate, comprising:
   receiving the silicon substrate with a first layer composed of a first material, wherein the first layer includes voids created by a first etching operation;
   forming a second layer composed of a second material over the first layer, so that the second layer fills in portions of the voids in the first layer created by the first etching operation; and
   performing A chemo-mechanical polishing operation on the second layer down to the first layer so that only remaining portions of the second layer within the voids created by the first etching operation remain;
   forming a third layer composed of a third material over the first layer and the second layer; and
   performing a second etching operation using a selective etchant to remove the remaining portions of the second layer so that voids are created between the first layer and the third layer;
   wherein the first material and the third material, are substantially the same material; and
   wherein an etch rate of the selective etchant through the second material is faster than an etch rate of the selective etchant through the first material and the third material, so that the second etching operation etches throught the remaining so that the second etching operation etches through the remaining portion of the second layer without significantly etching the first layer and the third layer.

2. The method of claim 1, wherein receiving the silicon substrate involves:
   receiving the silicon substrate with the first layer composed of the first material;
   applying a photoresist layer over the first layer;
   exposing the photoresist layer through a mask;
   developing the exposed photoresist layer, whereby portions of the photoresist layer defined by the mask are removed, so that portions of the first layer are exposed;
   performing the first etching operation to create voids in exposed regions of the first layer; and
   removing the photoresist layer.

3. The method of claim 1, wherein the first etching operation is a reactive ion etch.

4. The method of claim 1, wherein the chemo-mechanical polishing operation takes place after forming the third layer.

5. The method of claim 4,
   wherein the second layer is a conformal layer that fills part but not all of a void created by the first etching operation; and
   wherein the third layer fills in a remaining portion of the void created by the first etching operation.

6. The method of claim 1, wherein the voids created between the first layer and the third layer define one or more capillaries between the first layer and the third layer.

7. The method of claim 1,
   wherein the first material comprises Si—Ge or Si—Ge—C;
   wherein the second material comprises Si; and
   wherein the selective etchant comprises KOH.

8. The method of claim 7,
   wherein the first material comprises Si—Ge—C, wherein the carbon is greater than or equal to one atomic percent; and
   wherein the selective etchant is KOH—H$_2$O.

9. The method of claim 7,
   wherein the first material comprises Si—Ge—C, wherein the carbon is less than or equal to one atomic percent; and
   wherein the selective etchant is KOH—H$_2$O.

10. The method of claim 1,
    wherein the first material comprises Si;
    wherein the second material comprises Si—Ge or Si—Ge—C; and
    wherein the selective etchant comprises TMAH or HNA.

11. The method of claim 1, wherein the second layer includes one or more silicon and/or polysilicon layers.

12. A method for using selective etching to form a structure on a silicon substrate, comprising:
    receiving the silicon substrate with a first layer composed of a first material, wherein the first layer includes voids created by a first etching operation;
    forming a second layer composed of a second material over the first layer, so that the second layer fills in portions of the voids in the first layer created by the first etching operation; and
    performing a chemo-mechanical polishing operation on the second layer down to the first layer so that only remaining portions of the second layer within the voids created by the first etching operation remain;
    forming a third layer composed of a third material over the first layer and the second layer; and
    performing a second etching operation using a selective etchant to remove the remaining portions of the second layer so that voids are created between the first layer and the third layer;
    wherein the first material comprises Si—Ge or Si—Ge—C;

wherein the second material comprises Si;

wherein the selective etchant comprises KOH; and wherein an etch rate of the selective etchant through the second material is faster than an etch rate of the selective etchant through the first material and the third material, so that the second etching operation etches throught the remaining portion of the second layer without significantly etching the first layer and the third layer.

13. The method of claim 12, wherein receiving the silicon substrate involves:

receiving the silicon substrate with the first layer composed of the first material;

applying a photoresist layer over the first layer;

exposing the photoresist layer through a mask;

developing the exposed photoresist layer, whereby portions of the photoresist layer defined by the mask are removed, so that portions of the first layer are exposed;

performing the first etching operation to create voids in exposed regions of the first layer; and removing the photoresist layer.

14. The method of claim 12, wherein the first etching operation is a reactive ion etch.

15. The method of claim 12, wherein the first material and the third material are substantially the same material.

16. The method of claim 12, wherein the chemo-mechanical polishing operation takes place after forming the third layer.

17. The method of claim 16, wherein the second layer is a conformal layer that fills part but not all of a void created by the first etching operation; and wherein the third layer fills in a remaining portion of the void created by the first etching operation.

18. The method of claim 12, wherein the voids created between the first layer and the third layer define one or more capillaries between the first layer and the third layer.

19. The method of claim 12, wherein the first material comprises Si—Ge—C, wherein the carbon is greater than or equal to one atomic percent; and wherein the selective etchant is KOH—$H_2O$.

20. The method of claim 12, wherein the first material comprises Si—Ge—C, wherein the carbon is less than or equal to one atomic percent; and wherein the selective etchant is KOH—$H_2O$.

21. The method of claim 12, wherein the second layer includes one or more silicon and/or polysilicon layers.

22. A method for using selective etching to form a structure on a silicon substrate, comprising:

receiving the silicon substrate with a first layer composed of a first material, wherein the first layer includes voids created by a first etching operation;

forming a second layer composed of a second material over the first layer, so that the second layer fills in portions of the voids in the first layer created by the first etching operation; and performing a chemo-mechanical polishing operation on the second layer down to the first layer so that only remaining portions of the second layer within the voids created by the first etching operation remain;

forming a third layer composed of a third material over the first layer and the second layer; and performing a second etching operation using a selective etchant to remove the remaining portions of the second layer so that voids are created between the first layer and the third layer;

wherein the first material comprises Si;

wherein the second material comprises Si—Ge or Si—Ge—C;

wherein the selective etchant comprises TMAH or HNA; and wherein an etch rate of the selective etchant through the second material is faster than an etch rate of the selective etchant through the first material and the third material, so that the second etching operation etches through the remaining portion of the second layer without significantly etching the first layer and the third layer.

23. The method of claim 22, wherein receiving the silicon substrate involves:

receiving the silicon substrate with the first layer composed of the first material;

applying a photoresist layer over the first layer;

exposing the photoresist layer through a mask;

developing the exposed photoresist layer, whereby portions of the photoresist layer defined by the mask are removed, so that portions of the first layer are exposed;

performing the first etching operation to create voids in exposed regions of the first layer; and removing the photoresist layer.

24. The method of claim 22, wherein the first etching operation is a reactive ion etch.

25. The method of claim 22, wherein the first material and the third material are substantially the same material.

26. The method of claim 22, wherein the chemo-mechanical polishing operation takes place after forming the third layer.

27. The method of claim 26, wherein the second layer is a conformal layer that fills part but not all of a void created by the first etching operation; and wherein the third layer fills in a remaining portion of the void created by the first etching operation.

28. The method of claim 22, wherein the voids created between the first layer and the third layer define one or more capillaries between the first layer and the third layer.

29. The method of claim 22, wherein the second layer includes one or more silicon and/or polysilicon layers.

* * * * *

UNITED STATES PATENT AND TRADEMARK OFFICE
CERTIFICATE OF CORRECTION

PATENT NO.   : 6,465,357 B1
DATED        : October 15, 2002
INVENTOR(S)  : Peterson et al.

It is certified that error appears in the above-identified patent and that said Letters Patent is hereby corrected as shown below:

Column 1,
Lines 18 and 19, GOVERNMENTS LICENSE RIGHTS, please delete the number, "N00014-96-0219" and replace with the number -- N00014-96-C-0219 --.

Signed and Sealed this

Twenty-eighth Day of January, 2003

JAMES E. ROGAN
*Director of the United States Patent and Trademark Office*